United States Patent [19]

Suzuki

[11] Patent Number: 4,802,175
[45] Date of Patent: Jan. 31, 1989

[54] OPTO-ELECTRIC LOGIC ELEMENTS

[75] Inventor: Syuji Suzuki, Tokyo, Japan

[73] Assignee: NEC Corporation, Tokyo, Japan

[21] Appl. No.: 845,893

[22] Filed: May 28, 1986

Related U.S. Application Data

[63] Continuation-in-part of Ser. No. 647,493, Sep. 5, 1984, abandoned.

[30] Foreign Application Priority Data

Sep. 6, 1983 [JP] Japan .............................. 58-163449
Apr. 17, 1986 [JP] Japan .............................. 59-76787

[51] Int. Cl.$^4$ ............................................. H01S 3/30
[52] U.S. Cl. .......................................... 372/8; 372/38; 372/44
[58] Field of Search ................. 372/8, 7, 38, 43, 44, 372/46; 357/19

[56] References Cited

U.S. PATENT DOCUMENTS

| | | | |
|---|---|---|---|
| 4,038,610 | 7/1977 | Nishizawa et al. | 372/8 |
| 4,483,004 | 11/1984 | Inaba et al. | 372/8 |
| 4,562,569 | 12/1985 | Yarn et al. | 372/50 |

Primary Examiner—William L. Sikes
Assistant Examiner—Georgia Y. Epps
Attorney, Agent, or Firm—Sughrue, Mion, Zinn, Macpeak & Seas

[57] ABSTRACT

An opto-electric logic element comprises a semiconductor laser having a differential gain characteristic or an optical bistable characteristic and supplied with at least one light input, and a control circuit for varying an injection current supplied to the semiconductor laser in accordance with an input electrical signal. The logic element is capable of executing a logical operation between the optical signal and the electrical signal and can output the results of the logical operation as an optical signal.

4 Claims, 6 Drawing Sheets

| Pin1 | Pin2 | i | Pout |
|------|------|---|------|
| L | X | X | L |
| X | L | X | L |
| X | X | L | L |
| H | H | H | H |

FIG. 7

| P1 | P2 | i | Pout |
|----|----|---|------|
| L | L | L | L |
| H | X | X | H |
| X | H | X | H |
| X | X | H | H |

| | i | Pin | OPERATING POINT IN FIGS. 6A AND 6B | Pout |
|---|---|---|---|---|
| STORAGE STATE | ib | 0 | E OR F | Ph OR 0 |
| SET OPERATION | io | P3 | I | Ph |
| RESET OPERATION | | 0 | H | 0 |

FIG.16

OPTO-ELECTRIC LOGIC ELEMENTS

This is a continuation-in-part of application Ser. No. 647,493 filed 9/3/84, now abandoned.

BACKGROUND OF THE INVENTION

The present invention relates to an opto-electric logic element, and more particularly to an opto-electric logic element which is capable of performing a logical operation upon at least one optical input signal and at least one electrical input signal. The logic element may also be capable of storing an optical input signal.

Optical communications using optical fibers is expected to find wide use in the future, partially because optical fibers have a wide frequency bandwidth, which permits the rapid transmission of a large quantity of information. Also, optical fibers are immune to induction noise. In an optical communications system, the information to be transmitted is converted into an optical signal from an electrical signal by means of a transmitting apparatus, and the optical signal is transmitted through optical fibers and is subsequently converted into an electrical signal at a receiver. The optical signal is utilized as a mere transmission medium which serves to transfer a signal from one point to another, taking advantage of the fact that the transmission loss of the optical fibers constituting the transmission path is very small. Heretofore, the optical signals have not played a positive role in signal processing, i.e., logical operations have not been performed using optical signals, per se. The field of application of optical communications systems would be greatly widened if it were possible to perform logical operations upon combinations of optical and electrical signals. Likewise, if the storage of an optical signal could be accomplished under the control of an electrical signal, and if the results of operation and storage could be obtained in the form of optical signals, greater use could be made of optical communications systems.

SUMMARY OF THE INVENTION

It is an object of this invention to provide a novel opto-electric logic element which is capable of executing a logical operation in response to a combination of optical and electrical inputs, storing an optical signal, and outputting a result of such a logic operation in the form of an optical signal. According to the invention, there is provided an opto-electric logic element comprising a semiconductor laser having a differential gain characteristic or an optical bistable characteristic, which receives at least one light input, and a control circuit for varying the injection current to the semiconductor laser in accordance with an input electrical signal.

BRIEF DESCRIPTION OF THE DRAWINGS

Further objects and advantages of the invention will be more fully understood from the following detailed description taken in conjunction with the accompanying drawings, wherein.

DESCRIPTION OF THE PREFERRED EMBODIMENTS

Figure 1:
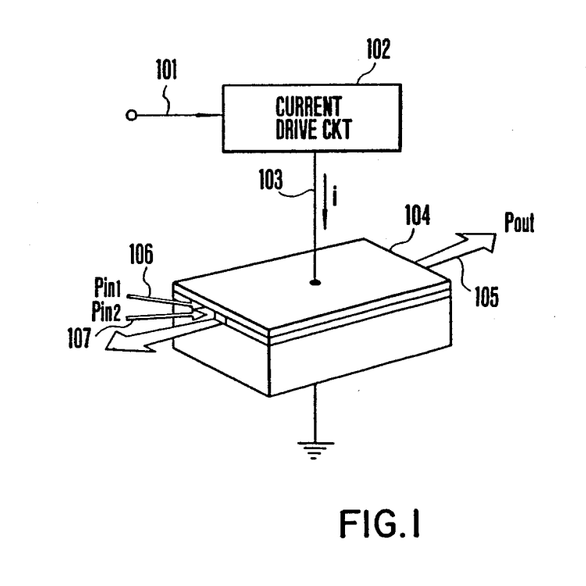
FIG. 1 is a perspective view showing a first embodiment of the invention.

Referring to FIG. 1, a first embodiment of the invention comprises a semiconductor laser 104 which receives optical input signals 106 and 107 and which outputs an optical output signal 105. A current drive circuit 102 varies a current i supplied to the semiconductor laser 104 via a signal line 103 in accordance with a signal on an input electrical signal line 101.

Figure 2:
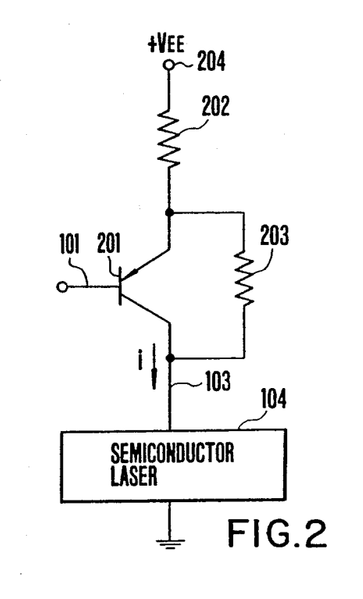
FIG. 2 is a circuit diagram illustrating a current drive circuit used in the first embodiment.

As shown in FIG. 2, the current drive circuit 102 shown in FIG. 1 comprises a transistor 201 having its base electrode connected to the signal line 101, a resistor 202 of resistance value $R_1$, having one end connected to the emitter electrode of transistor 201, a resistor 203 connected between the emitter and collector electrodes of the transistor 201 and having a resistance value $R_2$, and a power supply terminal 204 supplied with a voltage $+V_{EE}$ and connected to the other end of the resistor 202.

When a sufficiently large positive voltage is applied to the base electrode of the transistor 201 via signal line 101, the transistor 201 will be turned off so that a current i (equal to $V_{EE}/(R_1+R_2+r_1)$) will flow to the semiconductor laser 104 connected to the collector electrode of the transistor 201. In the foregoing equation for the current i, $r_1$ represents the internal resistance of the semiconductor laser 104.

When the base potential of transistor 201 is zero, the transistor 201 is turned on to supply a current i equal to $V_{EE}/(R_1+r_1+r_2)$ to the semiconductor laser 104, where $r_2$ represents the internal resistance of the transistor 201, and where $R_2$ is much greater than $r_2$. As described above, the circuit shown in FIG. 2 can supply a binary current to the semiconductor laser 104 in response to the voltage of an externally applied signal. The levels of the binary current can be set to any desired values by suitably selecting the resistances of resistors 202 and 203.

Figure 3:
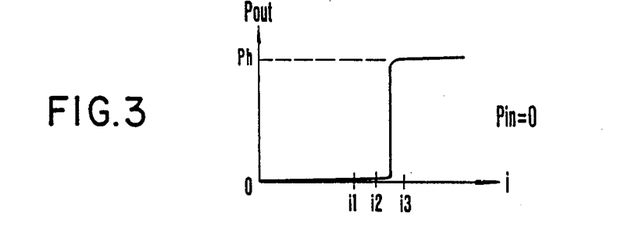
FIG. 3 illustrates the differential gain characteristic of the semiconductor laser under the condition where no input light signal is supplied to the laser.
Figure 4:
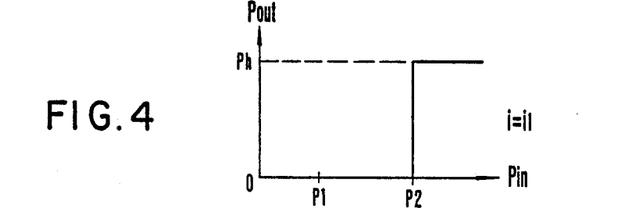
FIG. 4 shows the relation between the input and the output optical signals of the semiconductor laser when the injection current $i = i_1$.
Figure 5:
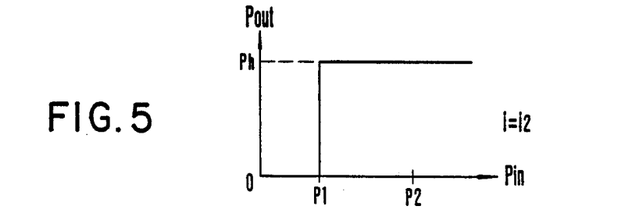
FIG. 5 illustrates the relation between the input and output optical signals of the semiconductor laser when the injection current $i = i_2$.
Figure 6:
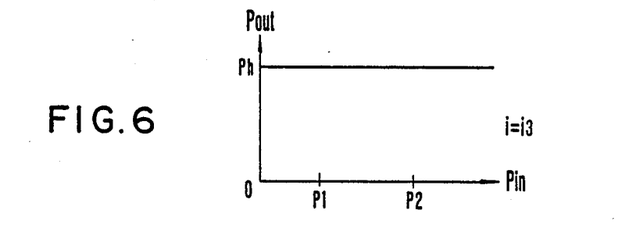
FIG. 6 illustrates the relation between the input and output optical signals of the semiconductor laser when the injection current $i = i_3$.

In connection with the semiconductor laser possessing a differential gain characteristic, FIG. 3 illustrates the relationship between the light quantity of the output optical signal 105 and the value of the injection current i, and FIGS. 4–6 illustrate the relationship between the light quantity $P_{out}$ and the total quantity of input light $P_{in}$, which is the sum of input light quantities $P_{in1}$ and $P_{in2}$. $P_{in1}$ represents the light quantity of the input optical signal 106 and $P_{in2}$ represents the light quantity of the input optical signal 107. In FIGS. 4, 5 and 6, the current i is respectively equal to $i_1$, $i_2$ and $i_3$ as illustrated in FIG. 3.

The curve of FIG. 3 is plotted for $P_{in}=0$. As will be noted from the differential gain characteristic of FIG. 3, as the current i increases from zero, the output light quantity $P_{out}$ increases rapidly from zero to $P_h=2$ mW between $i_2=25$ mA and $i_3=30$ mA.

Semiconductor lasers having such a differential gain characteristic are described in "Optical Bistable Switching Operation in Semiconductor Lasers With Inhomogenous Excitation", Proceedings of the Institution of Electrical Engineers, vol. 129, part 1, no. 4, August 1982, pp. 141–148. Such semiconductor lasers have a differential gain characteristic with respect to the relationship between the injection current and the absolute value of the quantity of output light, and are advantageous in that external elements such as wavelength filters and polarization filters, which were needed in conventional semiconductor lasers to obtain a differential characteristic, are no longer required. In the conventional semiconductor laser, the wavelengths of the output light and the polarization were varied by mode conversion of the laser.

FIG. 4 illustrates the relationship between the total quantity of input light $P_{in}$ and the quantity of output light $P_{out}$, with the value of the injection current i being set to $i_1=2$ mA $(0<i_1<i_2)$. With the differential gain characteristic of FIG. 4, as $P_{in}$ increases from zero, $P_{out}$ rapidly increases from zero to $P_h$ at a point where $P_{in}$ equals $P_2=30$ $\mu$W.

FIG. 5 illustrates the relation between the total quantity of input light $P_{in}$ and the quantity of output light $P_{out}$ when the value of the injection current is set to $i_2$, providing a differential gain characteristic in which as $P_{in}$ increases from zero, $P_{out}$ quickly increases from zero to $P_h$ at $P_{in}=P_1=10$ $\mu$W, where $P_1<P_2$. FIG. 6 illustrates the relation between the total quantity of input light $P_{in}$ and the quantity of output light $P_{out}$ when the value of the injection current i is set to $i_3$. When the injection current is at this level, the light quantity $P_{out}$ is maintained at a substantially constant value of $P_H$ regardless of the value of $P_{in}$.

To execute a logical product operation, the correspondence between the signal levels and the logic levels of each of $P_{in1}$, $P_{in2}$, i and $P_{out}$ is set as follows. Specifically, the light quantity $P_{inL}$ corresponding to a low level of each of $P_{in1}$ and $P_{in2}$ is set to satisfy the relation $P_{inL}<P_1/2$. The light quantity $P_{inH}$ indicative of a high level of $P_{in1}$ and $P_{in2}$ is set to satisfy the relations $P_1/2<P_{inH}<P_1-P_{inL}$ and $P_{inH}<P_2/2$. The value of the L (low) level of i is set to $i_1$, the H (high) level of i is set to $i_2$, the light quantity at the L level of $P_{out}$ is set to zero, and that at the H level is set to $P_h$. When the logic levels are set as described above, $P_{out}$ assumes the H level only when all of $P_{in1}$, $P_{in2}$ and i are at the H (high) level.

The reason for this will be described below. Where each of $P_{in1}$, $P_{in2}$ and i are at the H level, i is equal to $i_2$ and the total quantity of input light $P_{in}$ is equal to $P_{in1}+P_{in2}$, where $P_1<P_{in}<2(P_1-P_{inL})$ and $P_{in}<P_2$. Consequently, according to the relationship between $P_{in}$ and $P_{out}$ as shown in FIG. 5, $P_{out}$ assumes the level $P_H$, i.e., the H level.

On the other hand, when any one of $P_{in1}$, $P_{in2}$ and i assumes the L (low) level, $P_{out}$ assumes the low level. For example, when $P_{in1}$ is at the low level, $P_{in}<P_1$ and $P_{out}$ assumes the low level for either case of i ($i=i_1$ or $i=i_2$). In the case where $P_{in2}$ is at the low level, $P_{out}$ similarly assumes the low level. When i is at the low level, i.e., where $i=i_1$, $P_{in}<P_2$, and $P_{out}$ will be at the low level even if $P_{in1}$ and $P_{in2}$ are both at the high level.

Figure 7:
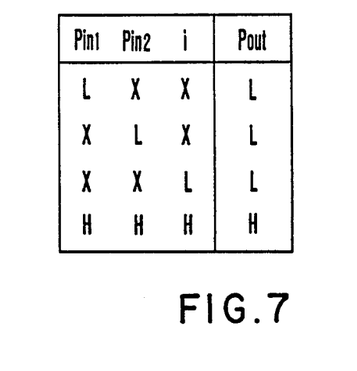
FIGS. 7 and 8 are truth tables useful in explaining the operation of the first embodiment of the invention.

FIG. 7 is a truth table illustrating the above logical relationship, in which the character X represents an arbitrary (don't care) level which may either be high or low. The truth table illustrates that $P_{out}$ assumes the low level when at least one of $P_{in1}$, $P_{in2}$ and i is at the low level, and that $P_{out}$ assumes the high level only when each of $P_{in1}$, $P_{in2}$ and i are at their high levels. When expressed in Boolean algebra, this logical relationship represents the logical product $P_{in1} \cdot P_{in2} \cdot i = P_{out}$.

On the other hand, in order to execute a logical sum operation, the values $P_{in1}$, $P_{in2}$, i and $P_{out}$ are made to correspond to the high and low logic levels in the following manner. Specifically, the light quantity $P_{inL}$ at the L level of $P_{in1}$ and $P_{in2}$ is set such that $P_{inL}<P_1/2$ and the light quantity $P_{inH}$ at the H level of $P_{in1}$ and $P_{in2}$ is set such that $P_1<P_{inH}$. The value of i at the low level L is set to $i_2$, the value of i at the H level is set to $i_3$, $P_{out}$ is set to zero at the low level, and $P_{out}$ at the high level is set at $P_h$. When the respective logic levels are set in this manner, $P_{out}$ assumes the high level H when at least one of $P_{in1}$, $P_{in2}$ and i are at the high level. This can be seen by the fact that when each of $P_{in1}$, $P_{in2}$ and i are at the low level, i is equal to $i_2$ and the total quantity of input light is such that $P_{in}=P_{in1}+P_{in2}$, which is less than $P_1$.

Consequently, from the relationship between $P_{in}$ and $P_{out}$ shown in FIG. 5, $P_{out}$ remains at zero, that is, it assumes the low level. When at least one of $P_{in1}$, $P_{in2}$ and i assumes the high level, $P_{out}$ becomes high. For example, when $P_{in1}$ is at the high level, $P_1<P_{in}$ and $P_{out}$ assumes the high level whether $i=i_2$ or $i=i_3$. In the same manner, with $P_{in2}$ being at the high level, $P_{out}$ assumes the high level as well. When $i=i_3$, that is, when i is at the high level, $P_{out}$ is always at the high level irrespective of the levels of $P_{in1}$ and $P_{in2}$.

Figure 8:
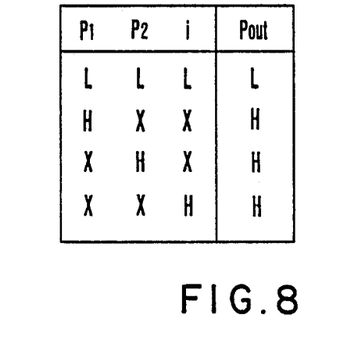

FIG. 8 is a truth table illustrating the logic relationship described above. In the table, the character X represents an arbitrary (don't care) level, which may either be high or low. The truth table indicates that $P_{out}$ assumes the low level only when $P_{in1}$, $P_{in2}$ and i are all at their respective low levels. When at least one of $P_{in1}$, $P_{in2}$ and i is at the high level, $P_{out}$ assumes the high level. When expressed in Boolean algebra, this logical relationship expresses the logical sum, i.e., $P_{out}=P_{in1}+P_{in2}+i$.

Similar logical operations can be accomplished using a semiconductor laser of the type exhibiting an optically bistable characteristic and having the same general construction as the semiconductor laser possessing differential gain as described above. The differential gain and optical bistable characteristics of semiconductor lasers are described in detail in the August 1982 excerpt of the Proceedings of the Institution of Electrical Engineers, referred to above.

Figure 9:
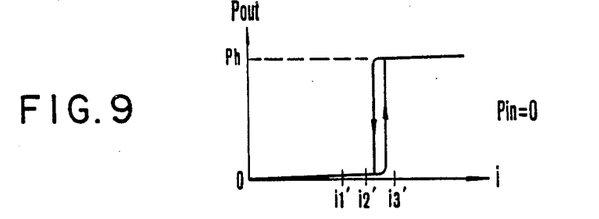
FIG. 9 illustrates the bistable characteristic of a semiconductor laser under the condition where no input light signal is supplied to the laser.
Figure 10:
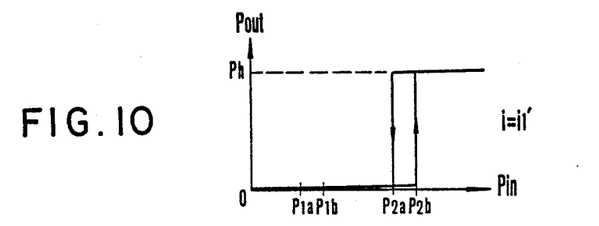
FIGS. 10–12 illustrate the relationships between the input and output optical signals of the laser of FIG. 9 where the injection currents i are respectively equal to $i_1$, $i_2$ and $i_3$.
Figure 11:
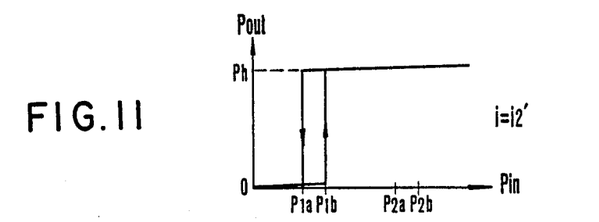
Figure 12:
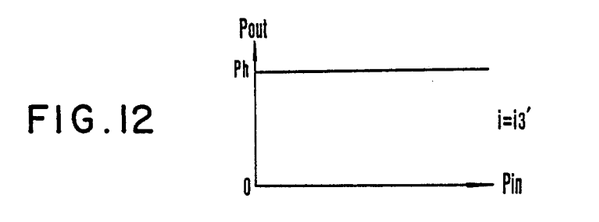

In connection with a semiconductor laser possessing an optical bistable characteristic, FIG. 9 illustrates the relationship between the output light quantity $P_{out}$ and the value of the injection current i. FIGS. 10–12 show the relationship between the light quantity $P_{out}$ and the total quantity of input light $P_{in}$, with the injection current i being the variable parameter.

The curve of FIG. 9 is plotted for a zero value of $P_{in}$. When the current i is increased from zero, $P_{out}$ rapidly increases from zero to $P_H$ (=2 mW) at a current value between $i_2'=25$ mA and $i_3'=30$ mA. Thereafter, regardless of the increase in the current i, $P_{out}$ is maintained substantially constant at the value $P_h$. When the current i is then decreased, $P_{out}$ decreases rapidly to zero at a current value which is smaller than the current value at which $P_{out}$ assumed the high level when the current was increasing. Thus, the laser manifests an optical bi-stable characteristic having a hysteresis loop. FIG. 10 illustrates the situation where the current i is equal to $i_1'$. As shown, when $P_{in}$ is increased from zero, $P_{out}$ rapidly increases from zero to $P_h$ at $P_{in}=P_{2b}=35$ μW, and, regardless of any further increase in $P_{in}$, $P_{out}$ is maintained substantially constant at the value $P_h$. Thereafter, when $P_{in}$ is decreased, an optical bistable characteristic is obtained wherein $P_{out}$ rapidly decreases from zero from $P_H$ at a value of $P_{in}=P_{2a}=30$ μW.

FIG. 11 illustrates the relationship between $P_{in}$ and $P_{out}$ when the injection current i is set to $i_2'$. As shown, when $P_{in}$ is increased from zero, $P_{out}$ rapidly increases to $P_h$ from zero $P_{in}=P_{1b}=15$ μW, and thereafter, $P_{out}$ is maintained substantially constant at the value $P_h$ regardless of any increase in $P_{in}$. When $P_{in}$ is subsequently decreased, $P_{out}$ rapidly decreases from $P_H$ to zero at a value of $P_{in}=P_{1a}=10$ μW, again manifesting an optical bistable characteristic.

FIG. 12 illustrates the relationship between $P_{in}$ and $P_{out}$ when the injection current i is set to $i_3'$. As shown, regardless of the value of $P_{in}$, $P_{out}$ is maintained substantially constant at the high level $P_h$.

When using the semiconductor laser having the optical bistable characteristic described above, the correspondence between the values $P_{in1}$, $P_{in2}$ and i and the high and low logic levels is set in the following manner, similarly to the case of the differential gain-type semiconductor laser. For the logical product operation, the total light quantity $P_{inL}$ of $P_{in1}$ and $P_{in2}$ at the low level is set to satisfy $P_{inL}<P_{1a}/2$. The total light quantity $P_{inH}$ at the high level is set to satisfy the relationship $P_{1b}/2<P_{inH}<P_{1a}-P_{inL}$ and $P_{inH}<P_{2a}/2$. The value of the current i at the low level is set to $i_2'$, and the value of i at the high level is set to $i_3'$. The light quantity $P_{out}$ at the low level is set to zero, and the light quantity $P_{out}$ at the high level is set to $P_h$.

In the logical sum operation, the total light $P_{inL}$ at the low level of $P_{in1}$ and $P_{in2}$ is set to satisfy $P_{inL}<P_{1a}/2$ and the total light quantity $P_{inH}$ at the high level of $P_{in1}$ and $P_{in2}$ is set to satisfy the relation $P_{1b}<P_{inH}$. The value of the current i at the low level is set to $i_2'$, and the value of the current i at the high level is set to $i_3'$. The light quantity $P_{out}$ at the low level is set to zero, and the light quantity $P_{out}$ at the high level is set to $P_h$. By setting the respective levels in this manner, similar logical operations as are achieved with the differential gain-type laser are likewise possible through the use of a bistable-type semiconductor laser.

Figure 13:
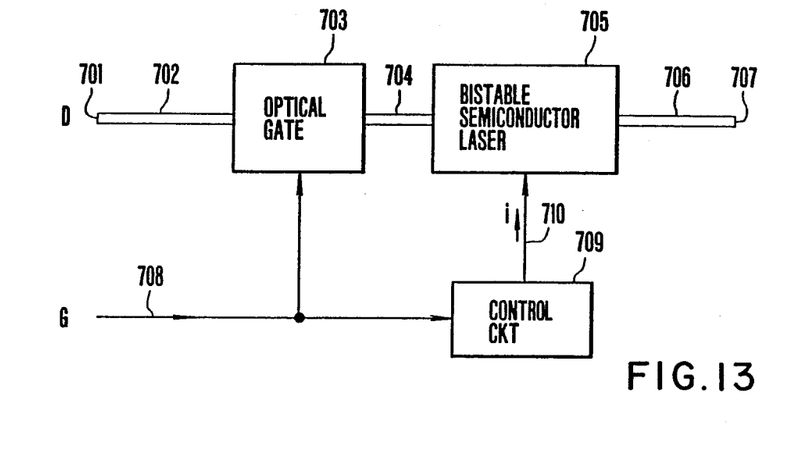
FIG. 13 is a block diagram illustrating a second embodiment of the invention.

FIG. 13 illustrates a second embodiment of the invention which includes an optical waveguide path 702 which receives an optical data input signal D at an end 701. An optical gate 703 has an input terminal at the other end of the optical waveguide path 702, and is enabled and disabled by means of a gate input signal G on a signal line 708. An optical waveguide path 704 with one end connected to the output terminal of the optical gate 703 has its other end connected to a bistable semiconductor laser 705. An optical waveguide path 706 has one end connected to the output terminal of the bistable semiconductor laser 705; output laser light is emitted at end 707. A control circuit 709 operates to control the value of the injection current i into the bistable semiconductor laser 705 in accordance with the gate input signal G on the signal line 708. The injection current is directed to the laser 705 by means of a conductor 710. The control circuit 709 may be the same or similar to the circuit shown in FIG. 2, and is similarly used to inject a binary current i into the semiconductor laser 705. The value of the current is varied according to the input signal G supplied through the signal line 708. The input signal D is a binary optical signal having a low level of zero and a high level of approximately 60 μW.

The semiconductor laser 705 is a bistable-type laser of the type described in "Optical Bistable-Switching Operation in Semiconductor Lasers With Inhomogeneous Excitation", Proceedings of the Institution of Electrical Engineers vol. 129, part 1, no. 4, August 1982, pp. 141–148. The connection of the optical waveguides 702, 704 and 706 with the optical gate 703 and the bistable semiconductor laser 705 may be made by confronting the active layer of the optical gate 703 and the bistable semiconductor laser 705 with the optical waveguide paths 702, 704 and 706. Alternatively, light may be coupled to and from the active layers of the gate 703 and laser 705 by means of lenses.

Figure 14:
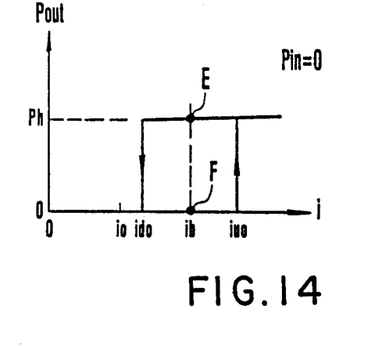
FIGS. 14 and 15 illustrate characteristics of the semiconductor laser used in the second embodiment of the invention.
Figure 15:
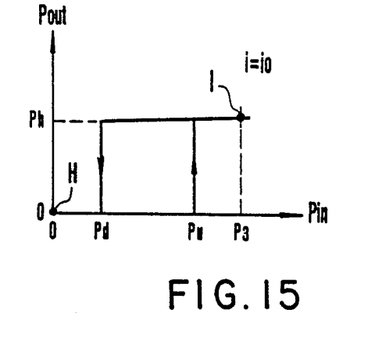

FIGS. 14 and 15 are characteristic curves which will be used to explain the operation of the bistable semiconductor laser 705 shown in FIG. 13. The Figures illustrate the relationships among the injection current i injected into the laser via the conductor 710, the quantity of input light $P_{in}$ inputted via waveguide path 704 and the quantity of output light outputted through optical waveguide 706. FIG. 14 illustrates the relationship between i and $P_{out}$ when $P_{in}$ is zero. As can be noted from FIG. 14, the bistable semiconductor laser manifests a hysteresis characteristic. In other words, when the injection current i is increased from zero, $P_{out}$ rapidly increases from zero to $P_h$ (=2 mW at a value of $i=i_{uo}=40$ mA. Thereafter, regardless of a continued increase in i, $P_{out}$ is maintained substantially constant at the value $P_h$. On the other hand, when the current i is subsequently decreased, $P_{out}$ rapidly decreases to zero from $P_h$ at a value of $i=i_{do}=20$ mA. As is apparent from FIG. 14, $i_{do}<i_{uo}$. When i is selected at a value $i_b=30$ mA defined by the relation $i_{do}<i_b<i_{uo}$, two stable operating states are obtained. Operating state E where $P_{out}=P_h$ is obtained in the case of decreasing current, and operating state F at $P_{out}=0$ is obtained in the case of an increasing injection current.

FIG. 15 illustrates the relationship between $P_{in}$ and $P_{out}$ when the injection current i is set to $i_o=15$ mA, which value is smaller than $i_{do}$. As shown, when $P_{in}$ increases from zero, $P_{out}$ rapidly increases from zero to $P_H$ at a point $P_{in}=P_u=40$ μW. Thereafter, even when $P_{in}$ is increased to $P_3=60$ μW, $P_{out}$ is maintained at a constant operation point I where $P_{out}$ is approximately equal to $P_h$. As $P_{in}$ is decreased, $P_{out}$ rapidly decreases to zero from $P_h$ at a value $P_d=20$ μW, which is smaller than $P_u$.

Figure 16:
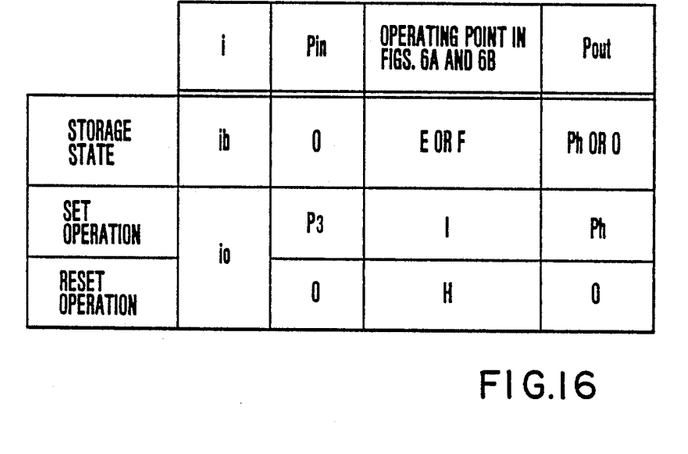
FIG. 16 is a table illustrating the operation of the second embodiment.

FIG. 16 is a table explaining the operation of the second embodiment of the invention shown in FIG. 13, which is capable of setting and storing an optical signal.

The table illustrates the relationships among the injection current i, the quantity of input light $P_{in}$, the operating points of the bistable semiconductor laser 705 shown in FIGS. 14 and 15, and the quantity of output light $P_{out}$. First, it will be assumed that the gate signal G is not being supplied on signal line 708 as shown in FIG. 13. At this time, since the optical gate 703 is disabled, the amount of light input to the laser 705 via waveguide 704 is zero regardless of the optical data input signal D input to the optical gate 703. At this time, the control circuit 709 injects a current $i_b$ into the bistable semiconductor laser 705 in response to the absence of the gate input signal G. In this situation (the stored state), the laser 705 will operate at one of the operating points E or F as shown in FIG. 14, and the quantity of output light $P_{out}$ will accordingly be maintained at $P_h$ or zero. When a gate input signal G is applied, the control circuit 709 supplies an injection current $i_o$ to the semiconductor laser 705. At the same time, the optical gate 703 is enabled or opened. Under these conditions, when a light data input signal D of light quantity $P_3$ is applied to the semiconductor laser 705 via the optical waveguide paths 702, 704 and the optical gate 703, the laser operates at operating point I shown in FIG. 15 so that the quantity of output light $P_{out}$ becomes $P_h$ (the set state). Thereafter, when the gate input signal G is removed, the quantity of light output $P_{out}$ from the laser is maintained at the high level to provide an output light quantity $P_h$ because the bistable semiconductor laser 705 operates at the operating point E shown in FIG. 14. In this manner, the signal D has been stored as an optical signal by the laser. When the injection current i becomes $i_b$ when the gate signal G is removed, the laser will continue to operate at the point E even though the quantity of input light $P_{in}$ becomes zero.

On the other hand, if the light data input signal D is not supplied (i.e. a low level D is supplied) when the gate input signal G on line 708 is applied to establish $i=i_o$ and to open the optical gate 703, the input light quantity $P_{in}$ to the laser 705 is zero, and the laser will operate at the operating point H shown in FIG. 15. In this condition, the output quantity $P_{out}$ is zero (the reset state). Thereafter, the laser 705 will operate at the operating point F when the current i is raised to $i_b$ and $P_{in}$ is set to zero in response to the removal of the gate input signal G, thereby ensuring that the output light quantity $P_{out}$ from the laser 705 is maintained at zero when a signal D of low level is stored. The optical gate 703 used in FIG. 13 can take the form of an electronic optical switch or the first embodiment of the invention shown in FIG. 1. A suitable electronic optical switch is described in detail, for example, in the article "Integrated Optical Switch Matrix for Single-Mode Fiber Networks", Institute of Electrical and Electronics Engineers, Journal of Quantum Electronics, October 1982.

What is claimed is:

1. An opto-electric logic element comprising:
   a semiconductor laser of a type having a differential gain characteristic with respect to the quantity of input light thereof in relation to the value of an injection current injected thereto;
   means for supplying at least one light input signal to said semiconductor laser;
   means for supplying an injection current to said semiconductor laser;
   said means for supplying an injection current comprising a control circuit for varying said injection current in response to a gate input signal;
   said values of said injection current and said at least one light input signal being selected such that said semiconductor laser emits an output optical signal representing a result of one of a logical summing operation and a logical multiplying operation upon said injection current and said at least one light input signal.

2. An opto-electric logic element, comprising: a semiconductor laser of a type having an optical bistable characteristic with respect to the quantity of output light thereof in relation to the value of an injection current injected thereto;
   means for supplying at least one light input signal to said semiconductor laser;
   means for supplying an injection current to said semiconductor laser;
   said means for injecting said injection current comprising a control circuit for varying said injection current in response to a gate input signal;
   said injection current and said at least one light input signal having values such that said semiconductor laser emits an optical output signal representing a result of one of a logical summing calculation and a logical multiplying calculation using said injection current and said at least one light input signal.

3. An opto-electric logic element comprising:
   an optical gate circuit for receiving an input electrical signal capable of assuming a binary state and blocking an optical signal when said input electric signal is in one state and passing said optical signal when said input electric signal is in another state;
   a control circuit responsive to said input electrical signal for producing an injection current of a value which varies in accordance with said binary state; and
   a bistable semiconductor laser supplied with an output of said optical gate circuit and with said injection current, for storing and emitting an optical output signal, one of said values ($i_0$) of said injection current being smaller than a current value corresponding to a falling point on a hysteresis curve of said semiconductor laser, and the other of said values ($i_b$) of said injection current comprising a value substantially intermediate of current values at rising and falling points of said hysteresis curve.

4. The apparatus as claimed in claim 3, wherein said control circuit supplies said injection current ($i_0$) when said input electrical signal assumes a state which operates to open said optical gate circuit, and supplies said injection current ($i_b$) when said input electrical signal assumes a state which operates to close said optical gate circuit, such that the output of said semiconductor laser during the application of said injection current ($i_b$) corresponds in level to the level of the optical input signal applied to said semiconductor laser when said optical gate circuit was last opened.

* * * * *

UNITED STATES PATENT AND TRADEMARK OFFICE
CERTIFICATE OF CORRECTION

PATENT NO. : 4,802,175

DATED : January 31, 1989

INVENTOR(S) : SUZUKI

It is certified that error appears in the above-identified patent and that said Letters Patent is hereby corrected as shown below:

Cover page, item 30, document 2, delete "Apr. 17, 1986" insert --Apr. 17, 1984--;

Column 7, line 64, delete "input" insert --output--;

Signed and Sealed this

Twenty-sixth Day of September, 1989

Attest:

DONALD J. QUIGG

Attesting Officer

Commissioner of Patents and Trademarks